United States Patent [19]
Hanson et al.

[11] Patent Number: 5,376,236
[45] Date of Patent: Dec. 27, 1994

[54] PROCESS FOR ETCHING TITANIUM AT A CONTROLLABLE RATE

[75] Inventors: Karrie Jo Hanson, Westfield; Barbara J. Sapjeta, Parsippany; Ken M. Takahashi, Warren, all of N.J.

[73] Assignee: AT&T Corp., Murray Hill, N.J.

[21] Appl. No.: 145,283

[22] Filed: Oct. 29, 1993

[51] Int. Cl.$^5$ .............................. H01L 21/00
[52] U.S. Cl. ................... 156/664; 156/651; 156/638; 252/79.3; 252/79.4
[58] Field of Search ........ 156/664, 651, 638; 252/79.1, 79.2, 79.3, 79.4

[56] References Cited

U.S. PATENT DOCUMENTS

| | | | |
|---|---|---|---|
| 3,468,744 | 9/1969 | Kendall | 204/141 |
| 3,562,013 | 2/1971 | Mickelson et al. | 134/3 |
| 3,844,859 | 10/1974 | Roni | 252/79.3 |
| 4,087,367 | 5/1978 | Rioult et al. | 252/79.1 |
| 4,126,523 | 11/1978 | Wong | 204/32 |
| 4,314,876 | 2/1982 | Kremer | 156/664 |
| 4,351,698 | 9/1982 | Osborne | 156/656 |
| 4,525,250 | 6/1985 | Fahrmbacker-Lutz | 204/58.5 |

OTHER PUBLICATIONS

"Chemical and Electrochemical Properties of Titanium in Fluorine–Containing Solutions"; Zh. Prikl. Khim. (Leningrad), 46(10); abstract only; 1973.

*Primary Examiner*—R. Bruce Breneman
*Assistant Examiner*—George Goudreau
*Attorney, Agent, or Firm*—Richard J. Botos

[57] ABSTRACT

A process for removing titanium from a device is disclosed. The titanium is etched at a controllable rate. The etchant oxidizes the titanium, and the oxidized titanium forms a complex in the etchant. When the concentration of this complex in the etchant nears its solubility limit, it precipitates and forms a film on the titanium metal surface. This film reduces the rate of the etch, enabling the amount of titanium removed by the etchant to be controlled.

22 Claims, 1 Drawing Sheet

PROCESS FOR ETCHING TITANIUM AT A CONTROLLABLE RATE

BACKGROUND OF THE INVENTION

1. Field of the Invention

The invention is directed to a process for etching titanium at a controllable rate.

2. Art Background

Devices such as multichip modules and hybrid integrated circuits are typically fabricated, in part, by depositing one or several layers of metal and/or polymer onto a substrate such as silicon or ceramic. Titanium metal is frequently used in the fabrication of devices to promote adhesion between the substrate and a metal layer, between the substrate and a polymer layer, or between a metal layer and a polymer layer.

The titanium layer is patterned during the fabrication of these devices by forming a patterned polymer mask (denominated a resist mask) over the titanium layer and removing the regions of the titanium metal that are not covered by the resist. The exposed titanium metal is removed by immersing the substrate in an etchant such as aqueous hydrogen fluoride (HF), or by spraying the etchant onto the substrate. HF etches through the native titanium oxide on the titanium surface in an amount of time that is sufficiently short to satisfy processing needs. However, the HF etches the titanium metal underlying the oxide at a much more rapid rate. Thus, an aqueous HF etchant that will etch through a thin layer of oxide (less than 100 Å) in 5 or 10 seconds will etch through a 1000 Å-thick titanium metal layer in less than one second.

The patterns in these devices, i.e., the metallized line dimensions and the spaces between the lines, are becoming increasingly fine. Currently, lines and spaces are typically 150 microns on printed circuit boards, 50 to 100 microns on ceramic substrates for multichip modules, and less than 10 microns on silicon devices. Finer lines and spaces allow greater density of components and active elements.

Aqueous HF etchants etch titanium isotropically. Therefore, regions of titanium that underlie a mask are susceptible to lateral attack from the etchant as the etch proceeds downward. This lateral component of the etch is referred to as undercut. As the linewidth becomes smaller, less undercut is advantageous. Therefore, especially when linewidths are small, it is desirable to terminate the etch as soon as the objectives of the etch are accomplished, i.e., the desired metal has been removed. However, it is extremely difficult to target the precise moment that the desired amount of metal has been removed, especially when the etch rate is rapid. Typically, the substrate is overetched to ensure that the requisite amount of metal is removed from the entire substrate. During the overetch, the etch continues to proceed laterally. Because HF etches titanium so rapidly, it is difficult to terminate the etch at a desired point. Consequently, it is difficult to reduce the degree of undercutting caused by overetch using a predominantly aqueous HF etchant. Therefore, a process that etches titanium in a controllable manner is desired.

SUMMARY OF THE INVENTION

The invention involves a process for etching titanium at a controllable rate and an etchant used in this process. The etch ram is controllable because products of the reaction between the titanium and components of the etchant form a film on the titanium, and this film slows the titanium etch rate. The film forms when these reaction products exceed their solubility limit in the etchant. Therefore, the titanium is etched at two rates during the inventive etch process. A first, fast rate (the active etch rate) which occurs before film formation and a second, slower rate (the controllable etch rate) after this formation. It is contemplated that the time during which the titanium is etched at the active rate will be effectively zero under certain circumstances. The film so formed is easily rinsed from the device after the etch is completed.

A substrate with titanium metal deposited thereon is combined with the etchant. Typically, a mask made either of a resist or a metal other than titanium is formed on top of the titanium metal so that only selected portions of the titanium layer are removed by the etchant. The etchant is an aqueous solution of HF and a salt which complexes with the titanium oxidized by the etchant. The solubility of the complex is controlled by the amount of salt in the etchant. Optionally, an organic solvent is also added to the etchant to control the solubility of the complex in the etchant. When the concentration of the complex in the etchant reaches its solubility limit, the film forms on the metal surface and the etch rate slows as described above.

DETAILED DESCRIPTION

A process for etching titanium at a controllable rate is desired. In the context of device fabrication, etching titanium at a controllable rate enables the amount of overetch to be reduced. Reducing the amount of overetch also reduces the undercut associated with the overetch.

The process of the present invention provides an etchant which induces film formation on the surface of the titanium metal surface during the etch. The film slows the rate at which the titanium metal is etched. Reducing the rate at which the titanium is etched also reduces the rate at which the titanium is overetched, thus limiting the undercut of the titanium beneath the mask.

The process of the present invention reduces the amount of overetch that occurs in two ways. First, the etch rate is slower near the end point of the etch due to film formation. Any overetch that does occur is at a slower rate. Therefore, less titanium is etched per unit time during the overetch portion of the etch. Therefore, less titanium metal is undercut during two or three seconds of overetch in the process of the present invention than in those processes that use an aqueous HF etchant to etch titanium at one rapid rate.

Second, the controlled etch rate is sufficiently slow so that there is sufficient time to remove the substrate from the etchant before overetching occurs to any great extent. This control is not available in processes that etch titanium metal using an HF etchant.

Figure 1A:
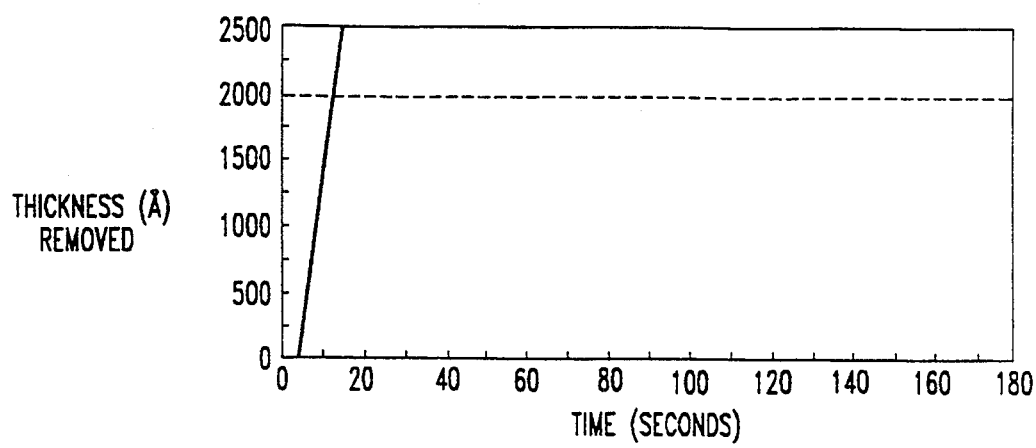
FIGS. 1(a) and 1(b) compare the etch rate of a prior art process with the etch rate of the process of the present invention.

The rapid rate at which titanium is etched by an aqueous HF (1.25 weight percent in water) solution is illustrated in FIG. 1(a). During the first two or three seconds of the etch, the oxide layer is removed. This period of the etch is referred to as the induction time. After the oxide layer is removed, the titanium is etched at a rapid rate which is apparent by the very steep slope.

Figure 1B:
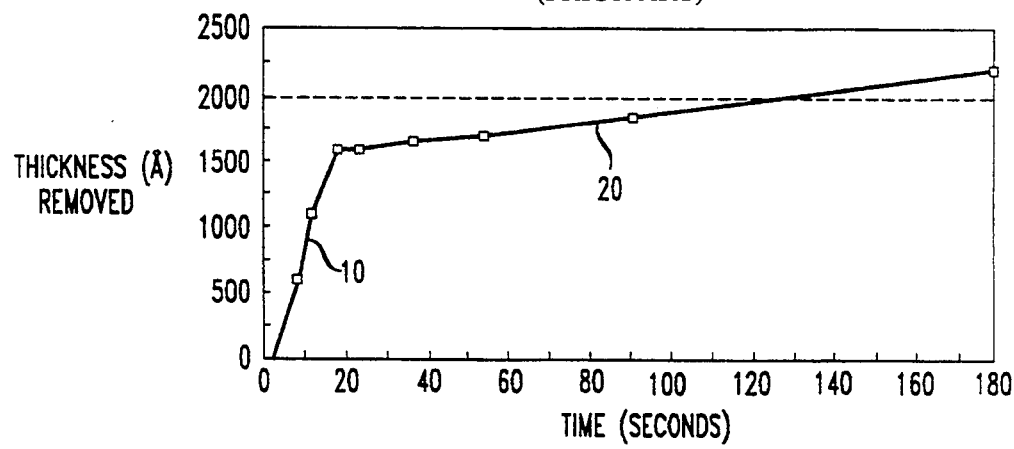

FIG. 1(b) illustrates the controllable etch of the present invention. In one embodiment, the etchant is an aqueous solution containing 30 volume percent propylene glycol, 2.7M ammonium fluoride, and 1.9M HF. The titanium is initially etched at the very rapid active etch rate. The slope of this portion of the curve 10 in FIG. 1(b) is almost as steep as the slope of the curve in FIG. 1(a). However, as the etch proceeds, the rate abruptly slows to the controllable etch rate 20.

Figure 2A:
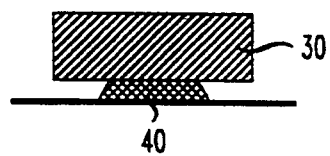
FIG. 2 illustrates the undercutting observed using a conventional process and the undercutting observed using the process of the present invention.
Figure 2B:
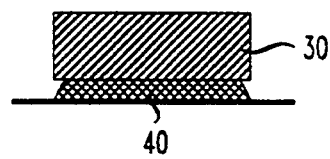

Another advantage of the inventive process is that it also inhibits the lateral progression of the etch. FIG. 2 illustrates the metal removed from underneath a mask during a solution etch. FIG. 2(a) illustrates the amount of titanium metal etched laterally from beneath the mask using aqueous HF etchants is significant. The titanium portion 40 is much narrower than the mask portion 30 because of the lateral progression of the etch. As previously discussed, this lateral etch reduces linewidth. If this lateral etch is particularly severe, an insufficient amount of the linewidth remains to anchor the material on top of the line. If inadequately anchored, the material on top of the titanium will lift off, which will result in the loss of an entire line. This result is more likely with narrower linewidths. The process of the present invention reduces the amount of overetch, and thus the consequences of overetching are avoided. FIG. 2(b) illustrates that, for a comparable etch time, less metal 40 is removed from underneath the mask 30 when the process of the present invention is used.

The etchant is a composition that includes ions (typically from a salt) which will complex with oxidized titanium. When the concentration of the complex in the etchant approaches its solubility limit, the complex precipitates, forming a film on the titanium surface. This causes the rate to change from the faster active etch rate to the slower controllable rate. The solubility limit of the complex in the etchant depends on the composition of the etchant.

The film formed by the etch is easily rinsed from the substrate when it is removed from the etchant. It is advantageous if water will rinse the film from the substrate.

It is advantageous if the acid in the etchant is HF. HF is advantageous because it dissolves titanium oxide at room temperature. Etchants that are used at room temperature provide certain processing advantages of which persons skilled in the art are aware. The concentration of the HF in the etchant is at least about 0.1M. Although strong acids such as sulfuric acid also dissolve titanium oxide, they do so only at elevated temperature. Therefore, other strong acids do not provide all of the processing advantages of HF in the process of the present invention, but are capable of being used if desired.

The salt in the aqueous etchant provides an anion which will complex with the titanium oxidized by the etchant. Suitable salts include ammonium halides and metal halides. It is advantageous if the metal halides are alkali or alkaline-earth metal halides. It is also advantageous if the halide in the salt is fluoride. Ammonium fluoride salt is particularly advantageous in the etchant of the present invention. The maximum concentration of the ammonium fluoride is limited by its solubility in the etchant. For example, the concentration of ammonium fluoride at its solubility limit in an aqueous HF solution is about 10M.

As stated previously, the solubility limit of the complex in the etchant depends upon the composition of the etchant. For example, in an etchant where the amount of water and HF remain constant, the solubility limit of the complex is increased by decreasing the concentration of salt in the etchant. The converse is also true, i.e., the solubility limit of the complex is decreased by increasing the concentration of salt in the etchant. By controlling the solubility limit of the complex in the etchant, the point in the process when the etch rate will change from the active etch rate to the controllable etch rate is also controlled.

The presence of a polar organic solvent in the etchant also reduces the solubility limit of the complex in the etchant. The presence of the polar organic solvent permits the concentration of the salt in the etchant to be reduced, yet enables the etchant to provide an environment from which the complex will precipitate when it reaches a certain concentration. Although one skilled in the art will appreciate that the amount of polar organic solvent in the etchant is variable depending on the objectives of a particular etch, an aqueous solution of HF and salt that contains about 20 volume percent to about 80 volume percent of a polar organic solvent will accomplish the objectives of most etches used in processes for device fabrication.

Suitable organic solvents are polar, having dielectric constant of about 15 to about 50. The polar organic solvent is either a lower aliphatic alcohol or a lower alkylene glycol. "Lower" as used herein means five or less carbon atoms are contained in a molecule of the alcohol. Methanol is an example of a suitable lower aliphatic alcohol. Ethylene glycol and propylene glycol are examples of lower alkylene glycols.

Figure 3:
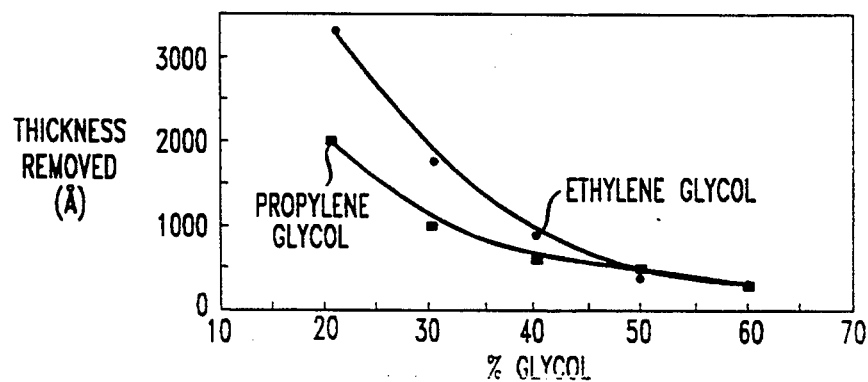
FIG. 3 is a graph illustrating the effect of the concentration of the organic solvent in the etchant on the amount of titanium removed during the active etch period.

As demonstrated by FIG. 3, the amount of polar solvent in the etchant is varied to provide an etch that meets specific objectives. FIG. 3 illustrates the thickness of titanium metal that is etched by etchants with varying concentrations of polar organic solvents, e.g., propylene glycol and ethylene glycol, before the etch rate decreases from the active rate to the controllable rate. The etchants had fixed concentrations of HF (1.9M) and NH$_4$F (2.7M).

FIG. 3 illustrates that if the etchant contains 60 percent by volume glycol, less than 500 Å of metal is etched before the etch rate decreases. By contrast, if the etch contains 20 volume percent glycol, more than 3000 Å of titanium metal are removed before the etch rate decreases. Thus, by varying the amount of solvent in the etchant one can control the amount of titanium that is etched before the etch rate decreases.

EXAMPLE 1

Sufficient amounts of propylene glycol, HF and NH$_4$F were combined to form an aqueous solution that was 30 volume percent propylene glycol, with a 1.9M HF concentration and a 2.7M NH$_4$F concentration.

A layer of titanium was deposited on a substrate. The titanium layer was about 1100 Å thick. A 25,000 Å thick layer of copper was deposited on top of the titanium layer. A photoresist was then deposited over the copper layer. A latent image of a pattern was then introduced into the photoresist, and the image was then developed. Standard techniques were used to deposit the metal and to deposit and pattern the photoresist. The copper was then etched to conform to the pattern in the photoresist.

The coated substrate was then sprayed with the etchant described above. The substrate was held in the solution for 10 seconds. The substrate was then removed from the solution. Undercuts of about 0.5 microns to about 1 micron were observed on the substrate. An undercut of several microns is expected when standard (1.25 weight percent) aqueous HF solutions are used to etch titanium under similar conditions.

We claim:

1. A process for fabricating a device having a layer of titanium comprising:
    contacting a titanium surface with an etchant comprising water, an acid and a salt, wherein the etchant oxidizes the titanium and induces film formation on the titanium layer and wherein the etchant oxidizes the titanium at a first rate before the film is deposited on the titanium surface and a second rate after the film is formed on the titanium surface.

2. The process of claim 1 wherein a portion of the titanium layer is covered by a mask.

3. The process of claim 1 wherein the etchant further comprises a polar organic solvent.

4. The process of claim 3 wherein the polar organic solvent has a dielectric constant of about 15 to about 50.

5. The process of claim 4 wherein the polar organic solvent is selected from the group consisting of lower aliphatic alcohols and lower alkylene glycols, wherein lower is defined as containing 5 or less carbon atoms per molecule.

6. The process of claim 5 wherein the lower aliphatic alcohol is methanol.

7. The process of claim 6 wherein the lower alkylene glycol is ethylene glycol.

8. The process of claim 7 wherein the lower alkylene glycol is propylene glycol.

9. The process of claim 3 wherein the concentration of polar organic solvent in the etching solution is about 20 volume percent to about 80 volume percent.

10. The process of claim 1 wherein the salt is selected from the group consisting of metal halide and ammonium halide salts.

11. The process of claim 10 wherein the salt is a fluoride salt.

12. The process of claim 11 wherein the fluoride salt is ammonium fluoride.

13. The process of claim 12 wherein the amount of the ammonium fluoride salt in the etching solution is an amount sufficient to provide an environment in which the film has limited solubility.

14. The process of claim 13 wherein the concentration of the ammonium fluoride in the solution is about 10M.

15. The process of claim 3 wherein the polar organic solvent is a lower aliphatic alcohol, the acid is HF and the salt is ammonium fluoride.

16. The process of claim 15 wherein the concentration of the lower aliphatic alcohol in the etchant is about 20 volume percent to about 80 volume percent and the concentration of HF in solution is at least about 0.1M.

17. The process of claim 1 wherein the amount of titanium oxidized at the first rate is essentially zero.

18. A process for etching a substrate having a layer of titanium deposited thereon comprising:
    contacting a titanium metal with an etchant comprising water, an acid and a salt wherein the etchant induces formation of a complex in the etchant, removing the titanium metal at a first rate when the concentration of the complex in the etchant is significantly below the solubility limit of the titanium complex in the etchant, and removing the titanium metal at a second rate when the concentration of the complex in the etchant is at about the solubility limit of the titanium complex in the etchant, wherein the first rate is faster than the second rate.

19. The process of claim 18 wherein the amount of titanium removed at the first rate is essentially zero.

20. The process of claim 18 wherein the etchant further comprises a polar organic solvent with a dielectric constant of about 15 to about 50.

21. The process of claim 20 wherein the polar organic solvent is a lower aliphatic alcohol, the acid is HF and the salt is ammonium fluoride.

22. The process of claim 21 wherein the concentration of the lower aliphatic alcohol in the etchant is about 20 volume percent to about 80 volume percent and the concentration of HF in solution is at least about 0.1M.

* * * * *